United States Patent
Rodrigues et al.

(10) Patent No.: US 10,112,731 B2
(45) Date of Patent: Oct. 30, 2018

(54) TRUSS STRUCTURE OPTIMIZATION TECHNIQUES

(71) Applicant: Space Systems/Loral, LLC, Palo Alto, CA (US)

(72) Inventors: Daniel Albino Rodrigues, Mountain View, CA (US); Michael Paul Freestone, El Granada, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 279 days.

(21) Appl. No.: 15/053,993

(22) Filed: Feb. 25, 2016

(65) Prior Publication Data

US 2016/0253444 A1 Sep. 1, 2016

Related U.S. Application Data

(60) Provisional application No. 62/126,332, filed on Feb. 27, 2015, provisional application No. 62/126,335, filed on Feb. 27, 2015.

(51) Int. Cl.
G06F 17/50 (2006.01)
B64G 99/00 (2009.01)
(Continued)

(52) U.S. Cl.
CPC .............. B64G 9/00 (2013.01); B64G 1/10 (2013.01); F16B 7/00 (2013.01); G06F 17/5018 (2013.01)

(58) Field of Classification Search
USPC .................................................. 703/1, 2, 7
See application file for complete search history.

(56) References Cited

U.S. PATENT DOCUMENTS 3,386,745 A 6/1968 Hein
3,665,670 A 5/1972 Rummler
(Continued)

FOREIGN PATENT DOCUMENTS

CN 102867101 A 1/2013
CN 103412997 A 11/2013
WO WO 2015/175892 A1 11/2015

OTHER PUBLICATIONS

Li et al., "Truss topology optimization with species conserving genetic algorithm," IEEE, 2014, 7 pages.
(Continued)

*Primary Examiner* — Thai Phan
(74) *Attorney, Agent, or Firm* — Weaver Austin Villeneuve & Sampson LLP

(57) ABSTRACT

Design of a 3-D truss structure, including a plurality of coupling nodes and a plurality of struts, is optimized by performing a quantitative optimization of an objective function corresponding to a figure of merit of the design. The quantitative optimization includes: generating a finite element analysis model, the analysis model a 3-D lattice mesh of strut-like finite elements; computing, with the finite element analysis model, a value for the objective function; and optimizing the objective function by executing at least two cycles of an optimization loop. The optimization loop includes a) computing a respective parameter of each strut-like finite element; b) deleting, from the finite element analysis model, selected finite elements for which a resulting mechanical property is less than a threshold; (c) computing an updated value for the objective function; and repeating the optimization loop until the objective function is within a desired tolerance of the specified value.

17 Claims, 12 Drawing Sheets

(51) Int. Cl.
*F16B 7/00* (2006.01)
*B64G 1/10* (2006.01)

(56) References Cited

U.S. PATENT DOCUMENTS

| | | | |
|---|---|---|---|
| 4,084,827 | A | 4/1978 | Wolf |
| 4,213,619 | A | 7/1980 | Arit et al. |
| 4,612,750 | A | 9/1986 | Maistre |
| 4,624,599 | A | 11/1986 | Piasecki |
| 4,637,193 | A | 1/1987 | Lange |
| 4,697,767 | A | 10/1987 | Witten et al. |
| 4,801,159 | A | 1/1989 | Sehorn |
| 4,982,546 | A | 1/1991 | Lange |
| 7,922,179 | B2 | 4/2011 | Andrick et al. |
| 8,126,684 | B2 | 2/2012 | Goel et al. |
| 8,784,998 | B2 | 7/2014 | Cap et al. |
| 8,855,977 | B2 * | 10/2014 | Hallquist ............ G06F 17/5018 703/2 |
| 9,512,949 | B2 | 12/2016 | Kauppi et al. |
| 2003/0216894 | A1 * | 11/2003 | Ghaboussi ............ E02D 1/022 703/2 |
| 2004/0128940 | A1 | 7/2004 | LaForge |
| 2005/0126106 | A1 | 6/2005 | Murphy et al. |
| 2008/0300831 | A1 | 12/2008 | Taggart et al. |
| 2010/0005752 | A1 | 1/2010 | Hawkins et al. |
| 2011/0108090 | A1 | 5/2011 | Lance et al. |
| 2012/0215498 | A1 * | 8/2012 | Hallquist ............ G06F 17/5018 703/1 |
| 2013/0185030 | A1 * | 7/2013 | Hallquist ............ G06F 17/5018 703/2 |
| 2013/0232907 | A1 * | 9/2013 | Jones, III .................. E04C 3/08 52/639 |
| 2014/0252744 | A1 | 9/2014 | D'Aluisio |

OTHER PUBLICATIONS

Kohta et al., "A design method for optimal truss structures with certain redundancy based on combinatorial rigidity theory," 10th World Congress on Structural and Multidisciplinary Optimization, May 19-24, 2013, Orlando, FL., 10 pages.

ATK An Advanced Weapon and Space Systems Company, "CCAT ATK Composite Strut Study Final Report," Dec. 13, 2010, 69 pages.

US Provisional Patent Application filed Jul. 2, 2014 entitled "Systems and Methods for Fabricating Joint Members".

International Search Report and Written Opinion dated Jun. 1, 2016 issued in PCT/US2016/019855.

U.S. Office Action dated Aug. 24, 2017 for U.S. Appl. No. 15/053,998.

U.S. Office Action dated Mar. 8, 2018 for U.S. Appl. No. 15/053,998.

\* cited by examiner

TRUSS STRUCTURE OPTIMIZATION TECHNIQUES

CROSS-REFERENCE TO RELATED APPLICATIONS

This disclosure claims priority to U.S. Provisional Patent Application No. 62/126,335; filed Feb. 27, 2015, entitled "TRUSS STRUCTURE," and assigned to the assignee hereof, and to U.S. Provisional Patent Application No. 62/126,332; filed Feb. 27, 2015, entitled "TRUSS STRUCTURE OPTIMIZATION TECHNIQUES," and assigned to the assignee hereof, the disclosures of which are hereby incorporated by reference in their entireties into this Patent Application.

TECHNICAL FIELD

This invention relates generally to truss-like structures, and more particularly to techniques for optimizing the design of truss structures.

BACKGROUND

The assignee of the present invention manufactures and deploys spacecraft for, inter alia, communications and broadcast services. Such spacecraft may include a large variety of payload equipment (e.g., electronics, antennas, antenna feeds, imaging systems) and bus equipment (e.g., propulsion equipment, attitude control electronics, sensors and actuators, solar arrays and batteries) mechanically coupled with a spacecraft structural support system. The spacecraft structural support system may be required to sustain large loads during launch, to experience large daily temperature excursions during the spacecraft's lifetime, and may be required to maintain precise respective alignment of various components mounted thereon.

A variety of structural elements may be configured to meet the aforementioned requirements while also seeking to achieve objectives of low mass, low coefficient of thermal expansion and high rigidity. Truss-like structures such as those disclosed in US Patent Publication No. 2004/0128940, assigned to the assignee of the present invention, and U.S. Pat. No. 3,665,670 have been found to provide desirably lightweight and rigid spacecraft structures. Design optimization of such structures, in the absence of the presently disclosed techniques, has proven expensive and time-consuming.

SUMMARY

The presently disclosed techniques relate to an improved truss-like structure and techniques for design optimization of such truss structures. The techniques particularly, though not exclusively, relate to a 3-D closed truss structure for use as a primary structure of a spacecraft.

According to some implementations, a structure supporting at least one component includes an arrangement design including a plurality of coupling nodes and a plurality of physical strut elements ("struts"), each strut disposed between and attached with a respective pair of the plurality of coupling nodes. The arrangement design results from performing a quantitative optimization of an objective function corresponding to a system performance characteristic of the arrangement design, the system performance characteristic having a specified value. The quantitative optimization includes: generating a finite element analysis model, the analysis model including boundary conditions and an initial dense 3-D lattice mesh of strut-like finite elements, each strut-like finite element having a respective set of one or more assumed mechanical properties that model a respective simulated strut, the boundary conditions including one or more input load parameters, and one or more of a mass, a moment of inertia and a thermal characteristic of at the at least one component; computing, with the finite element analysis model, a value for the objective function; optimizing the objective function by executing, on a processor, at least two cycles of an optimization loop. The optimization loop includes: the steps of (a) computing a respective parameter of each strut-like finite element; (b) adjusting the finite element analysis model by: (i) decrementing the assumed mechanical property of a first subset of the finite elements, each element in the first subset having a respective computed parameter that is less than a first threshold; and (ii) deleting, from the finite element analysis model, any finite element in the first subset for which a resulting mechanical property is less than a second threshold; (c) computing, with the adjusted finite element analysis model, an updated value for the objective function; and determining, when the updated value for the objective function is within a desired tolerance of the specified value, that the adjusted finite element analysis model represents a sufficiently optimized arrangement design, and, when the updated value for the objective function is outside the desired tolerance, repeating steps (a) through (c).

In some examples, the system performance characteristic may be stiffness, strength, or coefficient of thermal expansion of the arrangement design.

In some examples, adjusting the finite element analysis model may include incrementing the assumed mechanical property of a second subset of the finite elements, each element in the second subset having a respective computed parameter that exceeds a third threshold.

In some examples, adjusting the finite element analysis model may include smoothing the resulting finite element analysis model. In some examples, smoothing the resulting finite element analysis model may include replacing two or more respective simulated struts with a single simulated strut. In some examples, the two or more respective simulated struts may be respectively nonlinear.

In some examples, each set of one or more respective assumed mechanical properties may include one or more of stiffness, strength, diameter, length, and a thermal characteristic of the respective simulated strut.

In some examples, for at least the sufficiently optimized arrangement design, each set of one or more assumed mechanical assumed properties models a respective one of the plurality of physical struts.

In some examples, the structure may be a 3-D truss structure including an arrangement design of at least four coupling nodes and at least six physical struts connected at a plurality of joints.

According to some implementations, a method for optimizing an arrangement design of a 3-D truss structure supporting at least one component, the arrangement design including a plurality of coupling nodes and a plurality of physical struts, each strut being disposed between and attached with a respective pair of the plurality of coupling nodes, includes performing a quantitative optimization of an objective function corresponding to a figure of merit of the arrangement design, the figure of merit having a specified value. The quantitative optimization includes: generating a finite element analysis model, the analysis model including boundary conditions and a 3-D lattice mesh of strut-like finite elements, each strut-like finite element having a respective set of one or more assumed mechanical properties that model a respective simulated strut, the boundary conditions including one or more input load parameters, and one or more of a mass and a moment of inertia of at the at least one component; computing, with the finite element analysis model, a value for the objective function; optimizing the objective function by executing, on a processor, at least two cycles of an optimization loop. The optimization loop includes: a) computing a respective parameter of each strut-like finite element; b) adjusting the finite element analysis model by: (i) decrementing the assumed mechanical property of a first subset of the finite elements, each element in the first subset having a respective computed parameter that is less than a first threshold; and (ii) deleting, from the finite element analysis model, any finite element in the first subset for which a resulting mechanical property is less than a second threshold; (c) computing, with the adjusted finite element analysis model, an updated value for the objective function; and determining, when the updated value for the objective function is within a desired tolerance of the specified value, that the adjusted finite element analysis model represents a sufficiently optimized arrangement design, and, when the updated value for the objective function is outside the desired tolerance, repeating steps (a) through (c).

According to some implementations, a non-transitory computer readable medium has software stored thereon, the software including instructions for causing a computer to optimize an arrangement design of a 3-D truss structure supporting at least one component, the arrangement design including a plurality of coupling nodes and a plurality of struts, each strut disposed between and attached with a respective pair of the plurality of coupling nodes. The software including instructions for performing a quantitative optimization of an objective function corresponding to a figure of merit of the arrangement design, the figure of merit having a specified value. The quantitative optimization includes: generating a finite element analysis model, the analysis model including boundary conditions and a 3-D lattice mesh of strut-like finite elements, each strut-like finite element having a respective set of one or more assumed mechanical properties that model a respective simulated strut, the boundary conditions including one or more input load parameters, and one or more of a mass and a moment of inertia of at the at least one component; computing, with the finite element analysis model, a value for the objective function; optimizing the objective function by executing, on a processor, at least two cycles of an optimization loop. The optimization loop includes: (a) computing a respective parameter of each strut-like finite element; (b) adjusting the finite element analysis model by: (i) decrementing the assumed mechanical property of a first subset of the finite elements, each element in the first subset having a respective computed parameter that is less than a first threshold; and (ii) deleting, from the finite element analysis model, any finite element in the first subset for which a resulting mechanical property is less than a second threshold; (c) computing, with the adjusted finite element analysis model, an updated value for the objective function; and determining, when the updated value for the objective function is within a desired tolerance of the specified value, that the adjusted finite element analysis model represents a sufficiently optimized arrangement design, and, when the updated value for the objective function is outside the desired tolerance, repeating steps (a) through (c).

BRIEF DESCRIPTION OF THE DRAWINGS

Features of the invention are more fully disclosed in the following detailed description of the preferred embodiments, reference being had to the accompanying drawings, in which like reference numerals designate like structural element, and in which.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when a feature is referred to as being "connected" or "coupled" to another feature, it can be directly connected or coupled to the other feature, or intervening e feature s may be present. Furthermore, "connected" or "coupled" as used herein may include wirelessly connected or coupled. It will be understood that although the terms "first" and "second" are used herein to describe various features, these features should not be limited by these terms. These terms are used only to distinguish one feature from another feature. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items.

The terms "spacecraft", "satellite" and "vehicle" may be used interchangeably herein, and generally refer to any orbiting satellite or spacecraft system.

Figure 1:
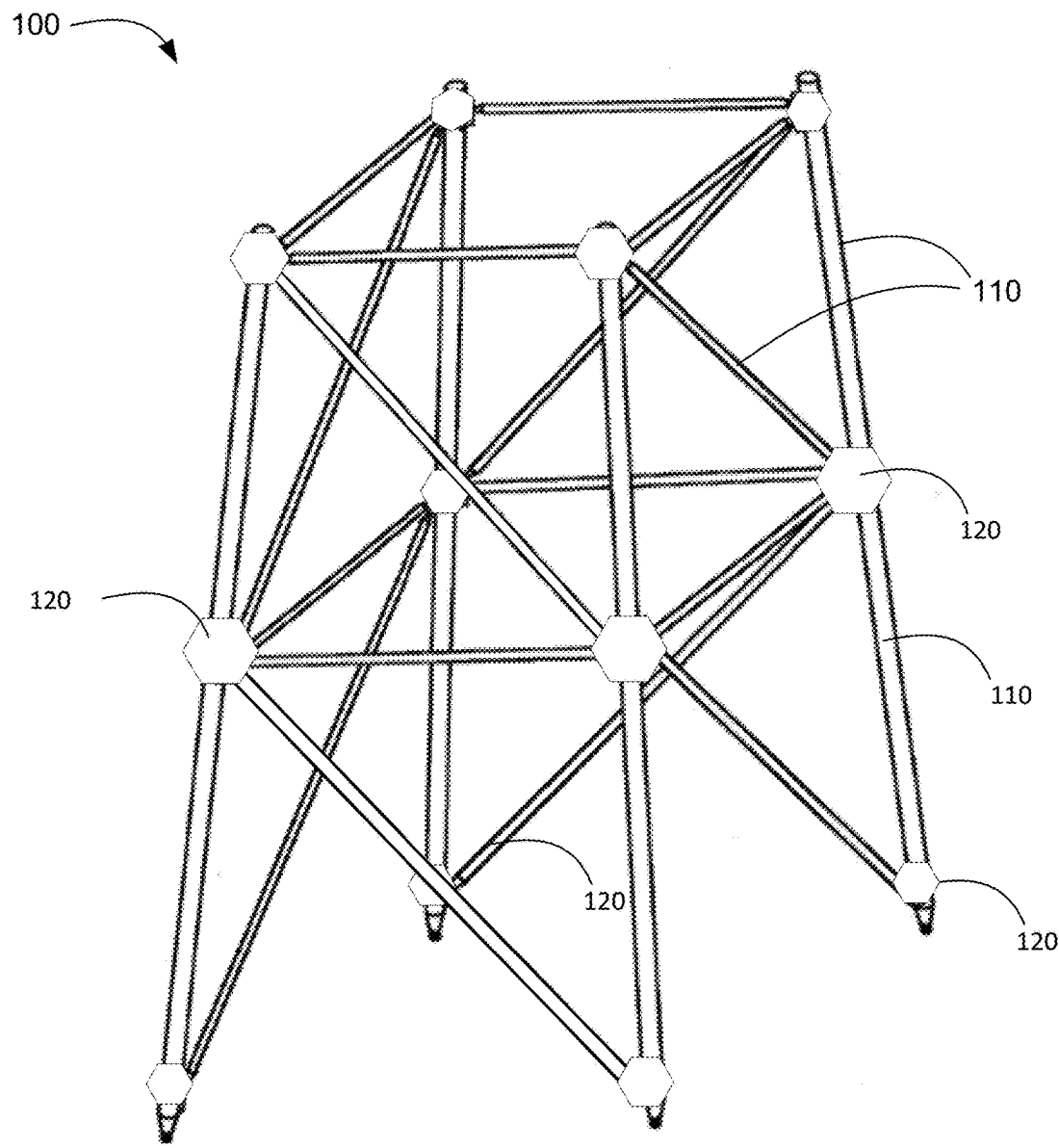
FIG. 1 illustrates an example of a 3-D truss structure.

A truss-like frame structure for space applications may include a number of coupling fittings ("coupling nodes" or "nodes") connected by strut elements ("struts"). Referring now to FIG. 1, structure 100 includes struts 110, each strut 110 being disposed between and mechanically coupling a pair of nodes 120. Each node 120 may be connected to two or more strut 110. The structure 100 desirably should be rigid, lightweight, and have a low coefficient of thermal expansion in order to meet the requirements of a typical spacecraft mission. Although the illustrated structure is relatively simple and symmetric, a complex and asymmetric arrangement of a large number of struts and couplings may be contemplated in order to support a variety of spacecraft equipment on a common structure.

In the absence of the present teachings, design optimization of such structures is a time-consuming and labor-intensive process. Typically, an experienced structural engineer may develop a design concept for an arrangement, prepare a structural model for finite element analysis (FEA) of the design concept, using for example a NASTRAN based software package. Based on the results of the FEA, the structural engineer may improve the design concept iteratively, until a resulting design is shown by the FEA to meet structural margin requirements such as stiffness, strength, and thermal elastic distortion. As found by the present inventors, the above described process, within practical time and cost constraints, results in a substantially less than optimal structural mass, in addition to being excessively labor-intensive.

The presently disclosed techniques enable design development and optimization of a complex truss-like structural arrangement ("truss structure") in a more time and cost effective manner. In some implementations, a computer-assisted method enables a truss structure arrangement design to be rapidly developed and optimized. Inputs to the method may include structural performance requirements, often expressed in terms of natural frequency, strength margin of safety, or thermal elastic distortion limits as well as interface parameters, and static and dynamic load requirements. The interface parameters may include specification of an interface between the truss structure and (1) equipment to be supported by the truss structure and/or (2) an underlying structural object supporting the truss structure. The presently disclosed techniques may include features described in a related patent application filed concurrently herewith and entitled "Truss Structure", attorney docket number LORLP260, owned by the assignee of the present application. The disclosure of the above-mentioned patent application is hereby incorporated in its entirety into the present application for all purposes.

Figure 2:
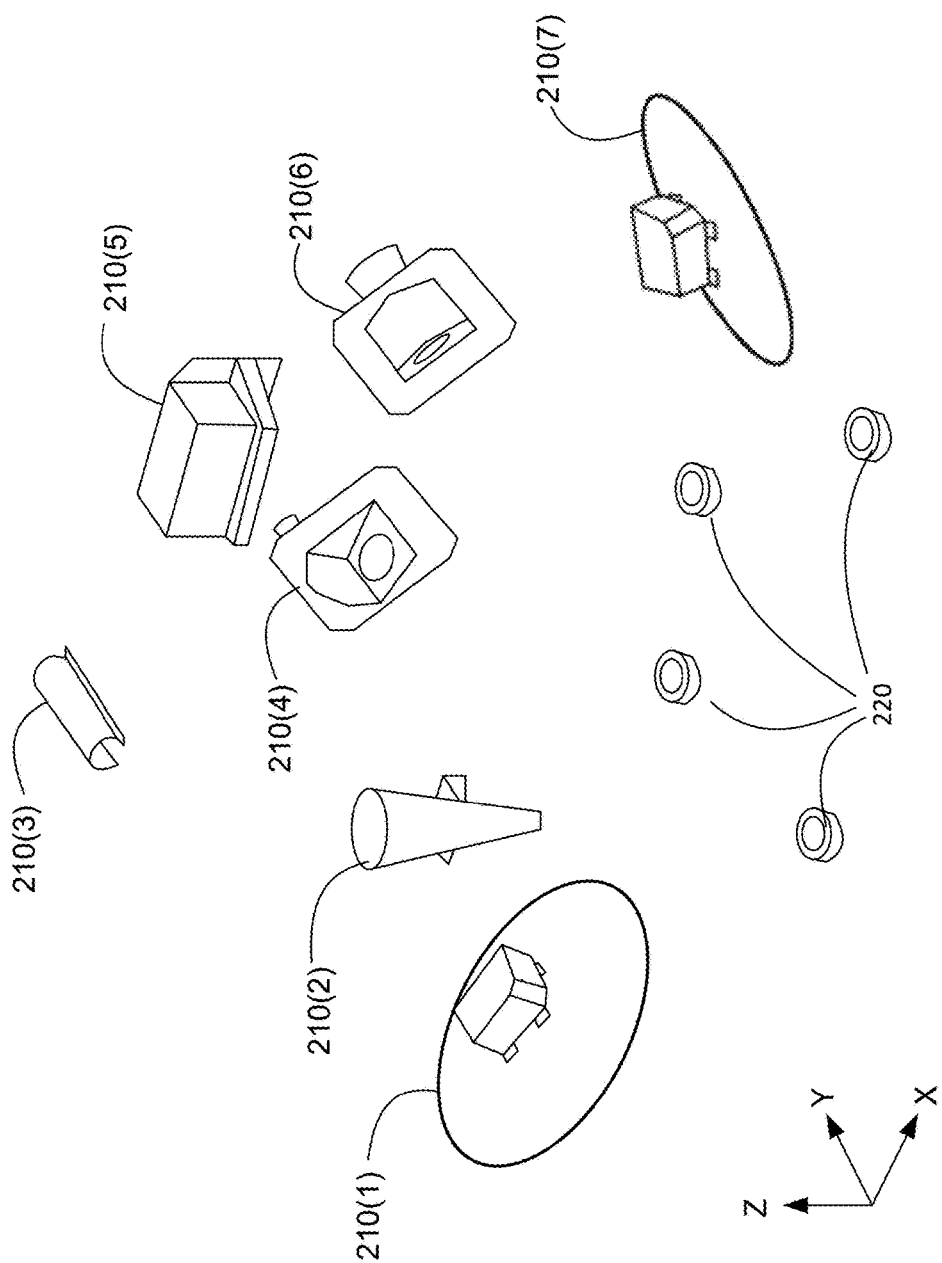
FIG. 2 illustrates a perspective view of an example set of interface parameters is illustrated.

Referring now to FIG. 2, a perspective view of an example set of interface parameters is illustrated. As will be described herein, a truss structure is to be designed that will rigidly support a plurality of equipment components 210 while having a set of mechanical interfaces 220 with an underlying structure. In some implementations, the equipment components 210 may be payload, attitude control or other equipment for a spacecraft that are to be mechanically coupled, by the truss structure, with the spacecraft or a launch vehicle by way of the mechanical interfaces 220.

Figure 3:
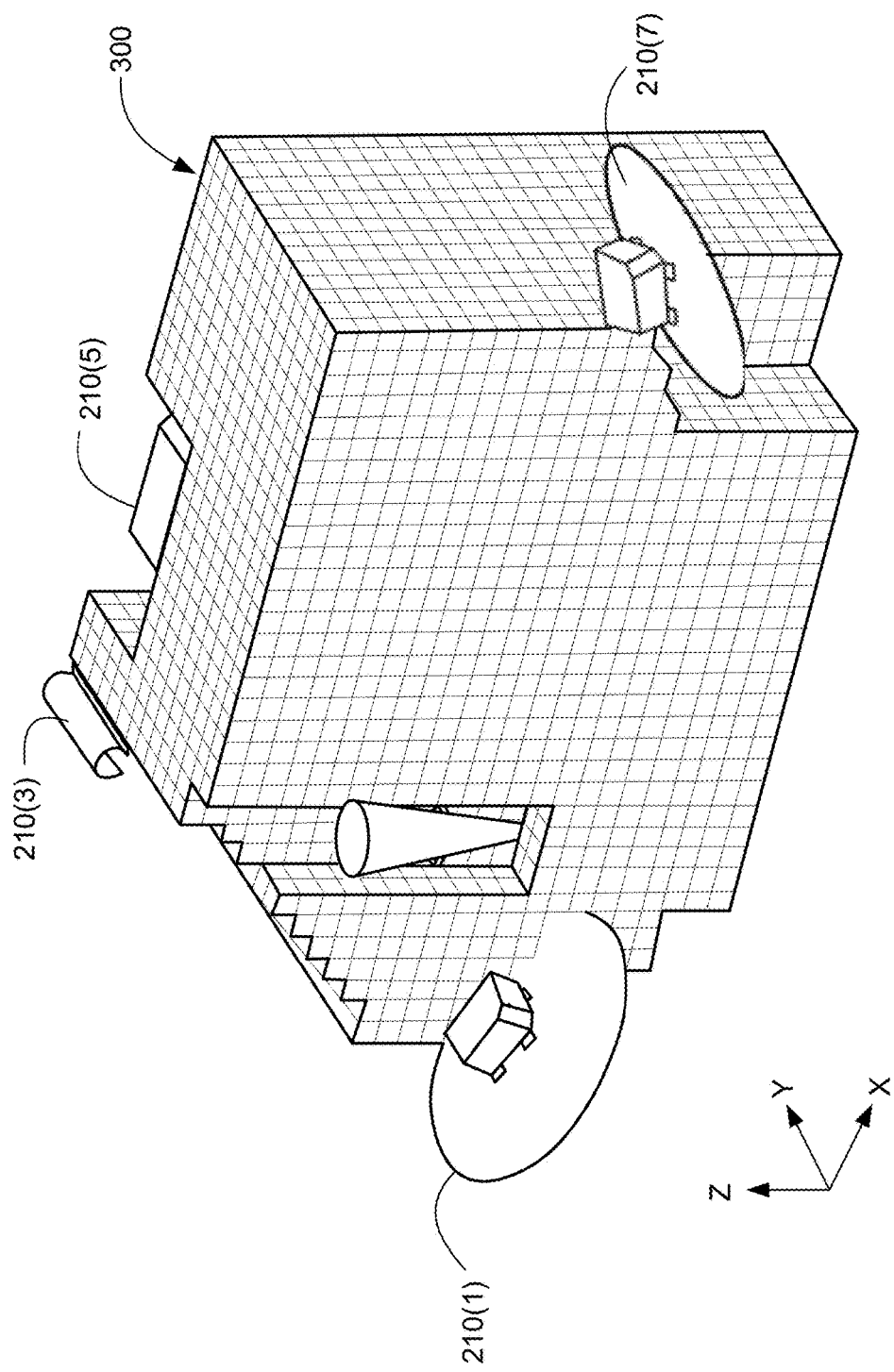
FIG. 3 illustrates a perspective view of an example 3-D design space in relation to which equipment components and mechanical interfaces are disposed, according to an implementation.
Figure 4:
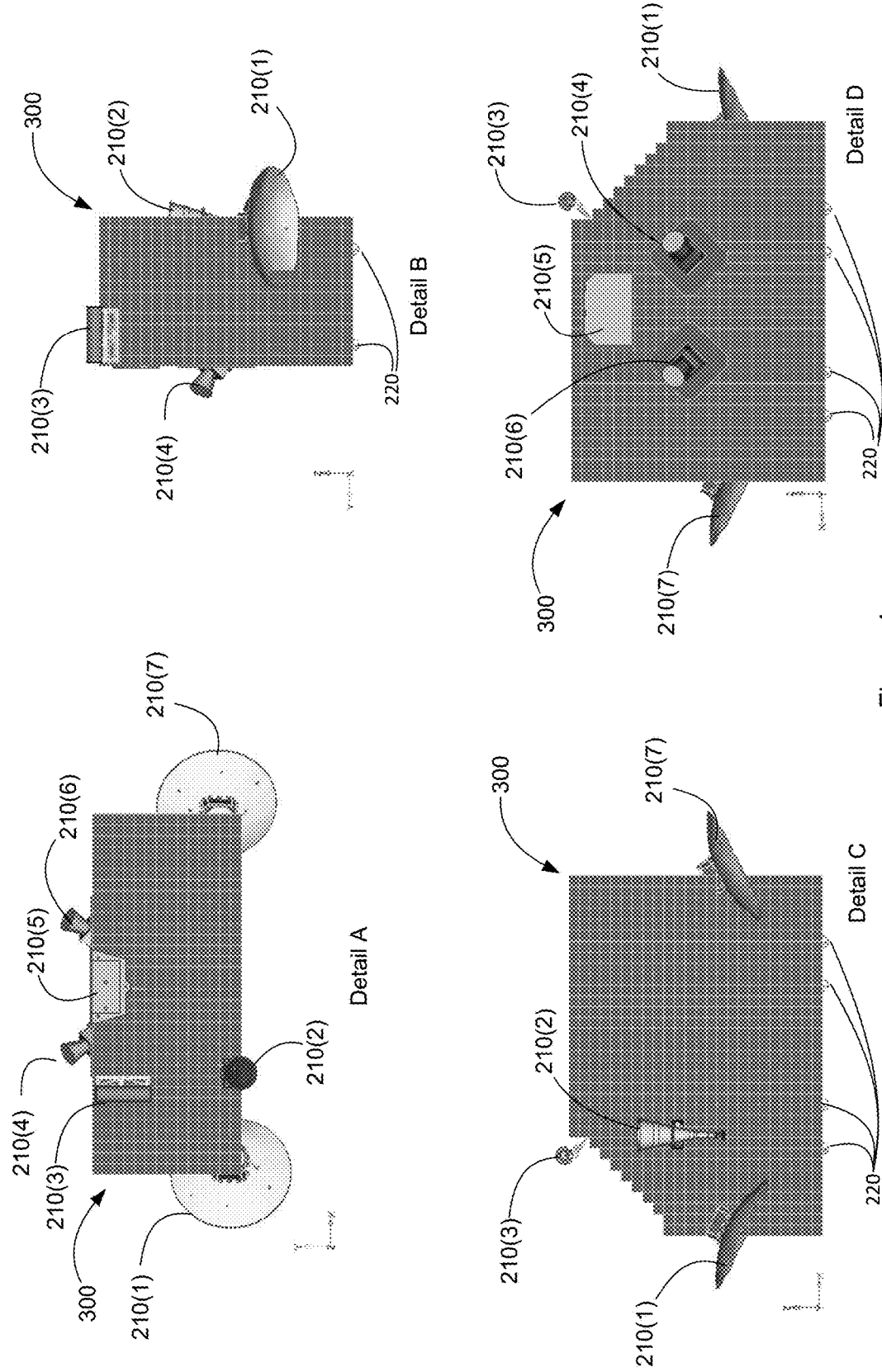
FIG. 4 illustrates a plan view and elevation views of the example design space.

FIG. 3 illustrates a perspective view of a 3-D design space in relation to which the equipment components 210 and the mechanical interfaces 220 (not illustrated) are disposed. FIG. 4 illustrates a plan view (Detail A) and elevation views (Details, B, C and D) of the design space 300, illustrating the locations of the equipment components 210 and the mechanical interfaces 220.

Figure 5:
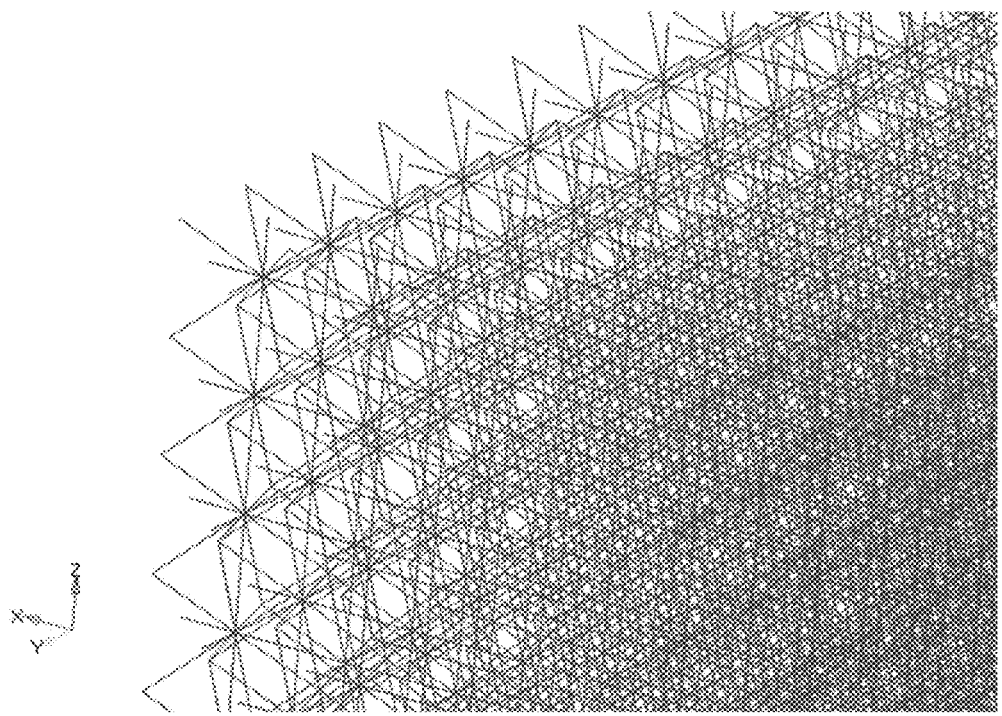
FIG. 5 illustrates a 3-D lattice mesh of strut-like finite elements, according to an implementation.
Figure 6:
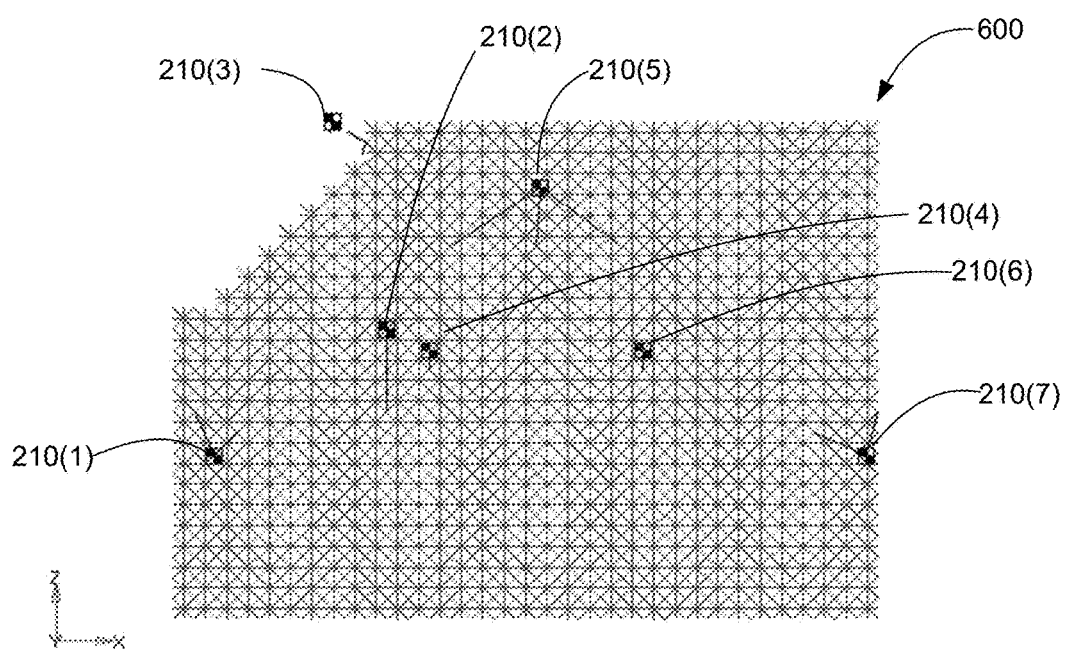
FIG. 6 illustrates a finite element analysis (FEA) model using a 3-D lattice mesh of strut-like finite elements, according to an implementation.

In accordance with the presently disclosed techniques, an FEA model, including a 3-D lattice mesh of strut-like finite elements as illustrated in FIG. 5, may be propagated within the design space 300. Referring to FIG. 6, the resulting FEA model 600 may include a definition of a structural interface definition between the equipment components 210 and the mechanical interfaces 220 (not illustrated). Each strut-like finite element may be initially assigned a respective assumed stiffness, strength, diameter, length and/or other mechanical properties. For example, each finite element may be configured to model a bar-like structure, each bar having a cross-sectional area, two moments of inertia, a torsional constant, and a material elastic modulus. Thus, each strut-like finite element may have a respective set of one or more assumed mechanical properties that model a respective simulated strut. In some implementations, the simulated strut may represent a hollow or solid longitudinal tube, for example. The initially assigned mechanical properties for some or all of the strut-like finite elements may be similar throughout the FEA model 300.

FIG. 6 illustrates a plan view of the FEA model 600 corresponding to Detail C of FIG. 4 in which the equipment components 210 are depicted as data points representing discretized lumped masses coupled with selected nodes of the FEA model 600. Some or all of the equipment components 210 may be represented by respective discreet and explicit finite element models coupled with the FEA model 600. The FEA model 600 may be configured to store, for each data point associated with a respective equipment component 210, an associated set of values of mechanical parameters, including for example, mass, center of mass, moment of inertia, and/or modeled properties representative of mechanical couplings between each center of mass and one or more of the selected nodes of the FEA 600. In some implementations, the mechanical couplings may include bracketry or other mounting hardware associated with one or more of the equipment components 210, and may be modeled by one or more of the respective finite element models.

The FEA model 600 is depicted as a 3-D tetrahedral truss lattice mesh. In some implementations, a computer-assisted method may include a script that generates an initial 3-D tetrahedral truss lattice mesh FEA model such as the one illustrated in FIG. 6 from a 3-D design space such as the one illustrated in FIGS. 3 and 4. The FEA model 600 may be configured to include a substantial number of interior nodes as well as boundary node locations that comply with interface parameters of the equipment components 210 and the mechanical interfaces 220.

It is contemplated that the initial 3-D tetrahedral truss mesh FEA model 600 may include a large number of nodes, and is therefore referred to herein as a "dense mesh". For example, referring now to FIG. 5, a close-up of a computer generated dense mesh is illustrated, according to some implementations.

Figure 7:
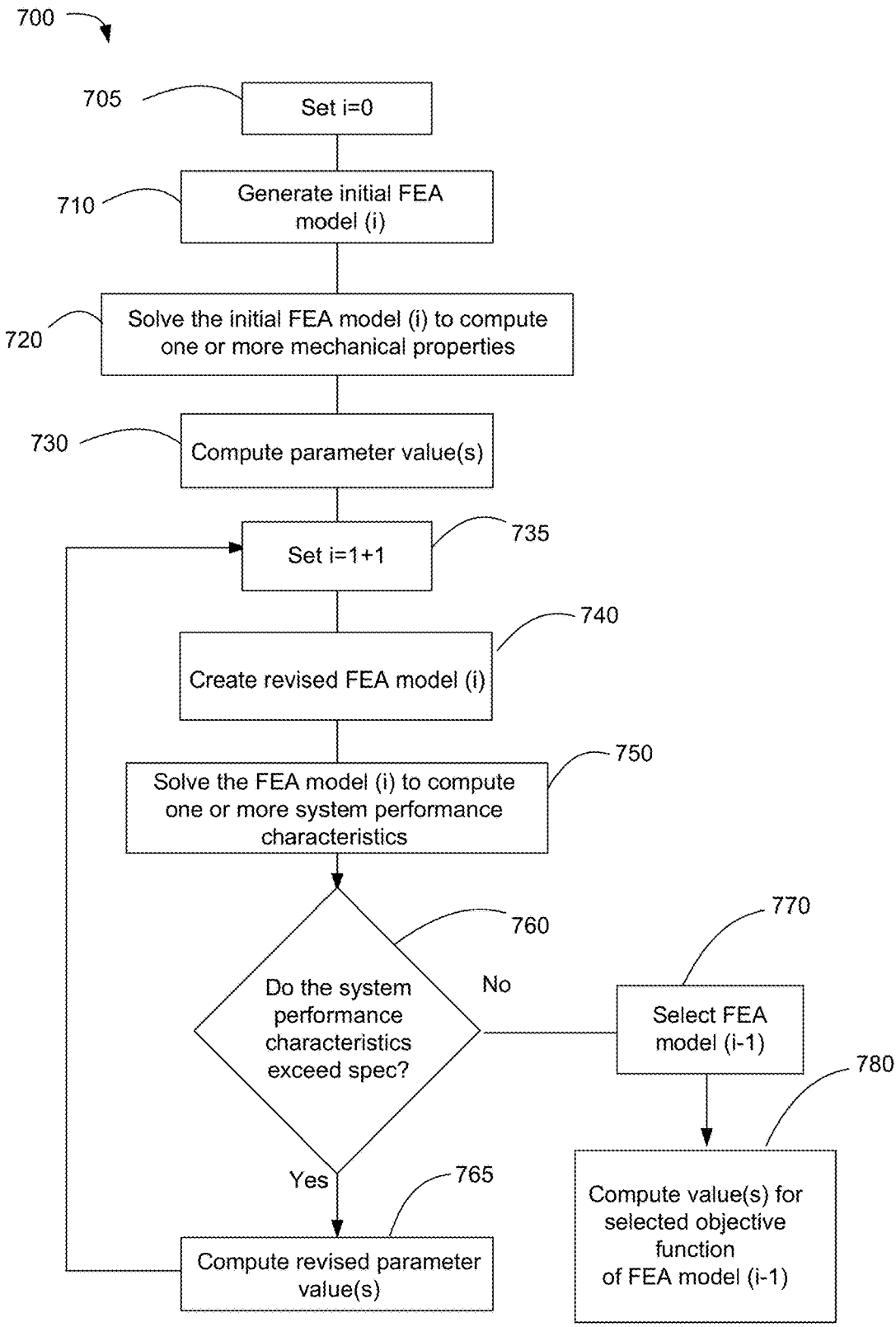
FIG. 7 illustrates a method for optimizing a truss-like structure starting with a dense mesh FEA model, according to an implementation.

Referring now to FIG. 7, a method for optimizing a truss-like structure starting with a dense mesh FEA model such as the one illustrated in FIG. 6 will be described. An objective of the method 700 is to improve a selected objective function (e.g., reduce structural mass) while maintaining compliance with required system performance characteristics such as stiffness, strength, and coefficient of thermal expansion. In some implementations, the method 700 may be executed by a computer processor. The method may start, at block 705, by setting a counter 'i' to zero, and, at block 710, generating an initial FEA model. As described above, the initial FEA model may be a dense 3-D lattice mesh of strut-like finite elements. Each finite element may initially be assigned a respective assumed stiffness, strength and/or other mechanical properties that model respective simulated struts. The initially assigned mechanical properties for some or all of the strut-like finite elements may be similar throughout the FEA model. The FEA model may include boundary conditions. For example the boundary conditions may include specification of an interface between selected nodes of the FEA model and (1) equipment to be supported by the truss structure and/or (2) an underlying structural object supporting the truss structure.

The method 700 may continue, at block 720, by solving the initial FEA model for one or more system performance characteristics. As used herein, and in the claims, the term "system performance characteristics" refers to metrics such as stiffness, strength, and coefficient of thermal expansion of the overall modeled structure. In some implementations, a sheaf of system performance characteristics may be obtained at block 720 that represent the system performance characteristics with respect to a range of anticipated environmental loads that the modeled truss-like structure may be required to withstand.

The method 700 may continue, at block 730, by computing one or more parameter values for each finite element in the FEA model. As used herein and in the claims, the one or more parameter values may include strain energy, stress, and thermal elastic distortion and be related to at least one anticipated environmental (dynamic, static, or thermal) load. In the case of dynamic environmental loads, the parameter value may be related to at least one mode shape.

The method 700 may continue, at block 735 by setting the counter 'i' to equal i+1, and at block 740, by creating a revised FEA model in view of the computed parameters obtained at block 730. Various techniques for revising the FEA model are within the contemplation of the present disclosure, as described hereinbelow. A common objective of the various techniques, however, is to reduce the number of nodes and finite elements, such that iterative execution of block 740 results in successive revisions of the FEA model having progressively fewer nodes and finite elements.

The method 700 may continue, at block 750, by solving the revised FEA model (i) to compute one or more system performance characteristics. Then, at block 760, the computed value(s) of the one or more system performance characteristics may be compared to one or more required (specified) values, and a determination may be made as to whether or not the computed values exceed the specification. In the event that the computed values exceed the specification, further iterations of the optimization loop may be desirable. Thus, if the determination at block 760 is that the one or more system performance characteristics exceed the specified value(s), the method may proceed to block 765 and compute revised parameter values for each finite element in the revised FEA model (i). Then blocks 735 through 760 may be repeated.

On the other hand, if the determination at block 760 is that the computed system performance characteristics do not exceed the specification, then further iterations of the optimization loop may preferably be avoided. Thus, if the determination at block 760 is that the one or more system performance characteristics do not exceed the specified value(s), the method may proceed to block 770 and select FEA model (i−1) as reflective of a structure for which the objective function, computed at block 780, is substantially optimal.

Figure 8:
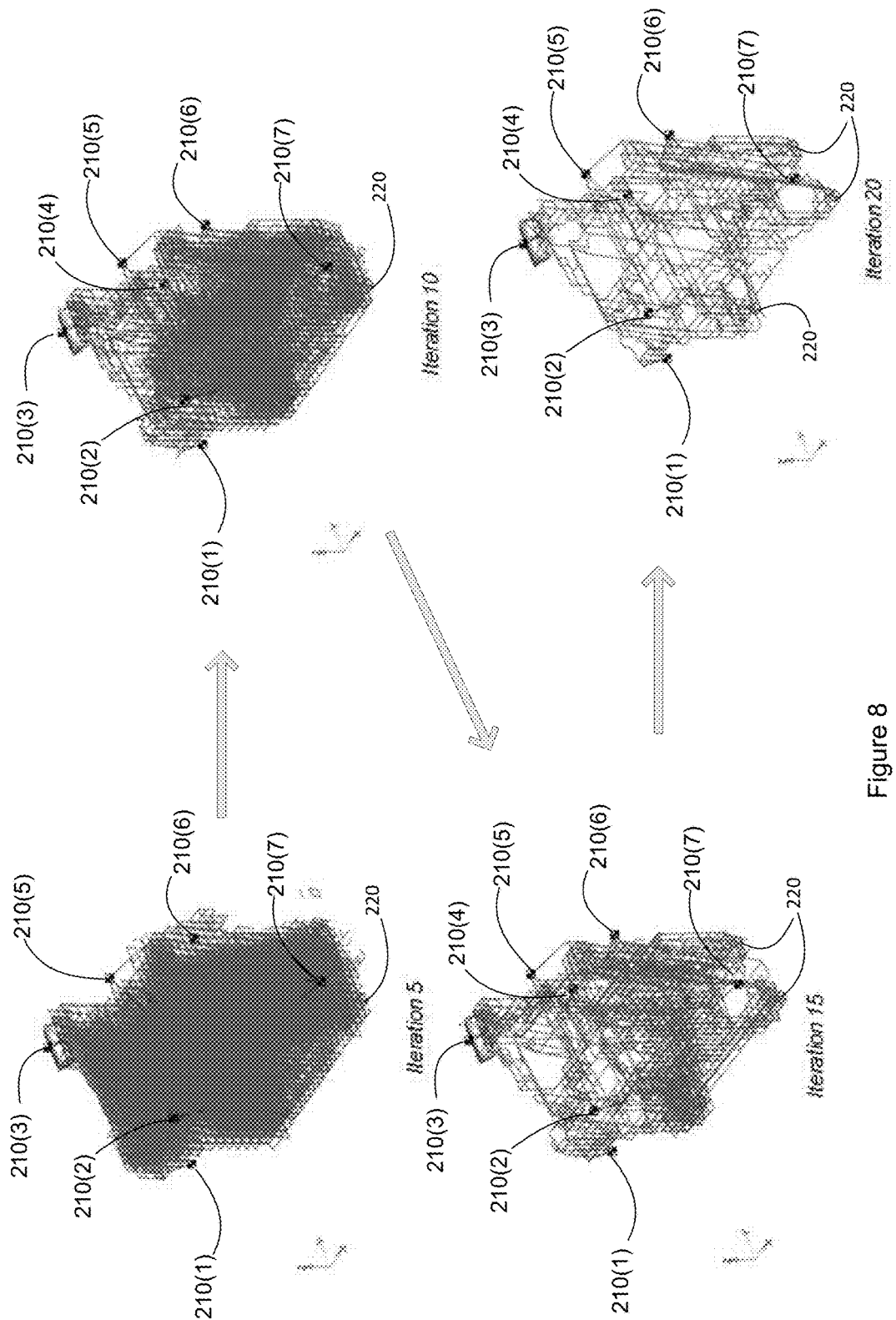
FIG. 8 illustrates example results of successive iterations of FEA model revision, according to an implementation.

A better understanding of the above described techniques may result from considering the following simplified example in which the objective function is mass reduction subject to a single constraint of stiffness, expressed in terms of a normal mode or eigenvalue. A truss-like structure to be optimized by the present techniques will have, in the present example, a specified system performance characteristic of a particular minimum stiffness. Desirably, the optimized truss-like structure should have the lowest possible mass while still meeting the minimum stiffness specification. Because the initial dense mesh FEA model is purposely over-populated with truss elements, an initially computed value of stiffness may be substantially higher than the specified minimum stiffness requirement. The present techniques contemplate an iterative procedure of adjusting the FEA model by systematically eliminating those nodes and strut-like finite elements that make a lesser contribution to meeting the stiffness requirement constraint. As successive iterations of FEA model revision are executed, the initially dense lattice mesh FEA model is gradually adjusted toward a sparse lattice mesh FEA model as illustrated in FIG. 8. As a result of eliminating selected nodes and finite elements, computed values of stiffness of the structure will be reduced. It is contemplated that the iterative procedure may continue until the computed value of stiffness is close to, or barely exceeds, the specified minimum stiffness requirement.

Figure 9:
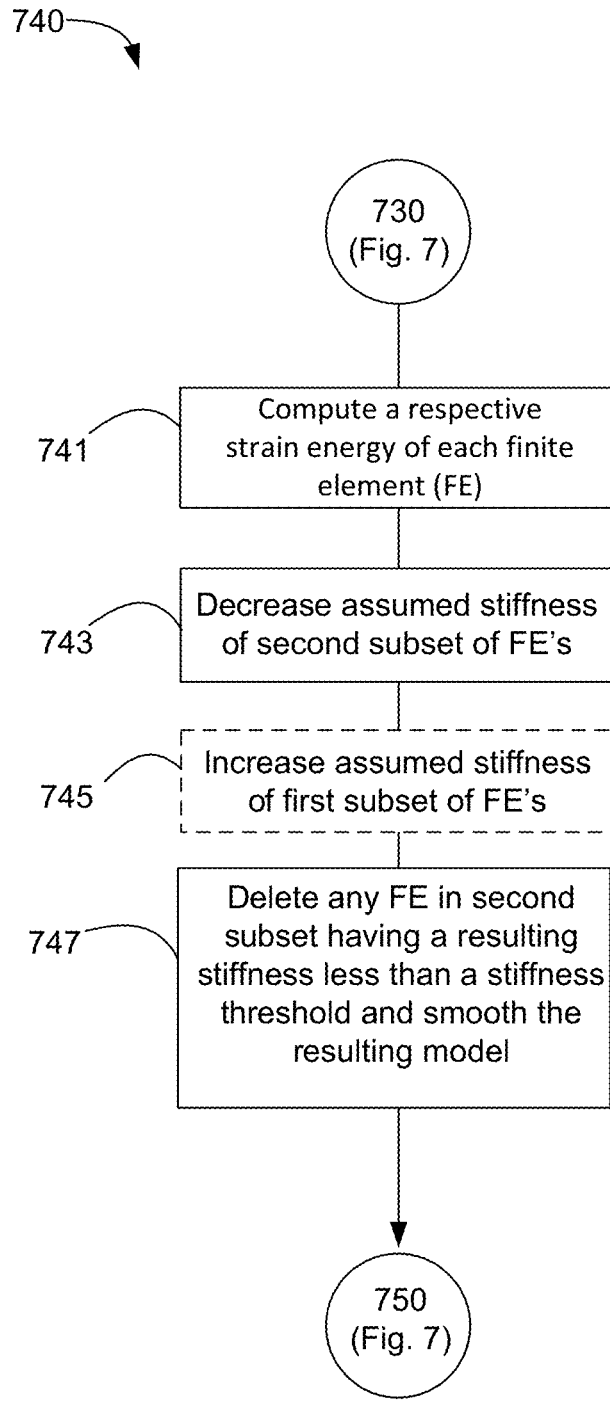
FIG. 9 illustrates an example technique for creating a revised FEA model, according to an implementation.

Referring now to FIG. 9, some particular techniques for creating a revised FEA model according to block 740 will be described. In some implementations, creating the revised FEA model according to block 740 includes computing, at block 741, a respective strain energy for each strut-like finite element in the FEA model. Each respective strain energy may relate to one or more dynamic vibration modes of the modeled structure.

At block 743 an assumed stiffness of a first subset of finite elements may be decreased (decremented). The assumed stiffness may be decremented by changing an assumed dimension and/or material property of the finite element. For example, an assumed diameter, cross-sectional area and/or elastic modulus of a strut or bar-like structure represented by the finite element may be decremented. In some implementations, the first subset of finite elements may include those finite elements having a respective computed strain energy that is less than a first threshold. For example, the first subset of finite elements may include those finite elements having a below average respective computed strain energy or those having a respective computed strain energy that is less than an otherwise determined relative or absolute value.

At block 745, optionally, an assumed stiffness of a second subset of finite elements may be increased (incremented). The assumed stiffness may be incremented by changing an assumed dimension and/or material property of the finite element. For example, an assumed diameter, cross-sectional area and/or elastic modulus of a strut or bar-like structure represented by the finite element may be incremented. In some implementations, the second subset of finite elements may include those finite elements having a respective computed strain energy that is greater than a second threshold. For example, the second subset of finite elements may include those finite elements having an above average respective computed strain energy or those having a respective computed strain energy that is greater than an otherwise determined relative or absolute value.

Figure 11:
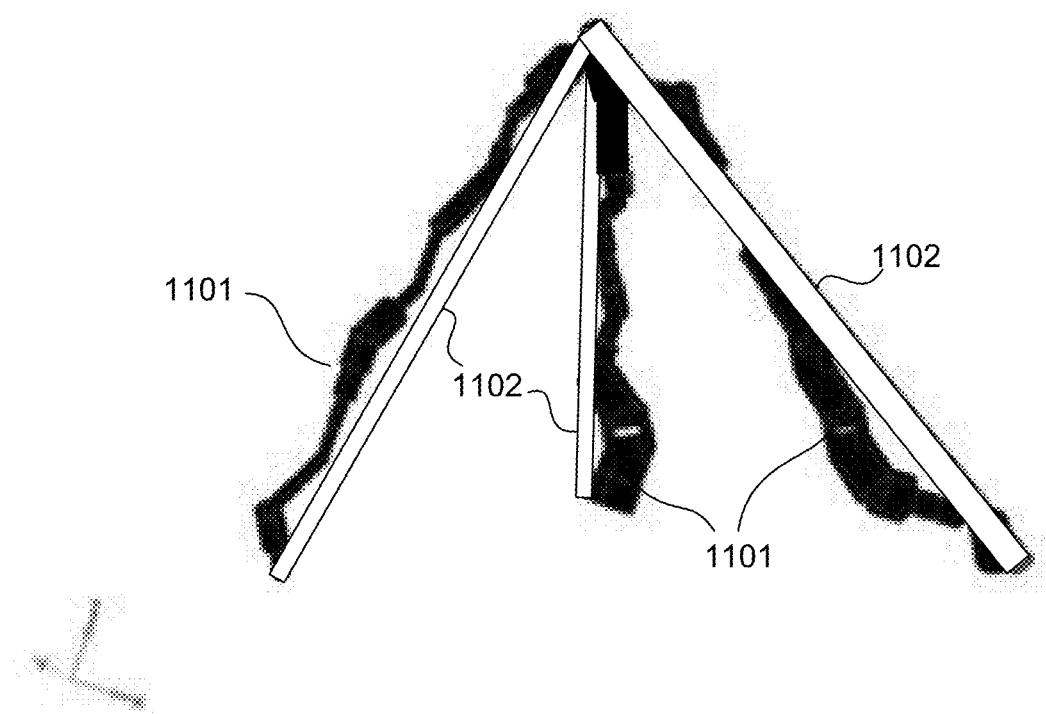
FIG. 11 illustrates an example technique of smoothing an FEA model, according to an implementation.

At block 747, finite elements in the second subset which have a resulting stiffness less than a stiffness threshold may be deleted from the FEA model. In addition, the resulting model may be "smoothed". Smoothing the model may be better understood by referring again to FIG. 8, where it may be observed that over the course of successive iterations a number of finite elements may be deleted from an initially dense mesh FEA model. As finite elements are deleted from the FEA model, some nodes may become isolated, and may in turn be deleted. In addition, some connections, representative of load paths or portions of load paths between equipment components 210 and/or mechanical interfaces 220, may include a series of finite elements linked with nodes in which the finite elements fail to lie on a straight-line. Referring to FIG. 11, for example, it may be observed that outputs 1101 of the FEA model include finite elements that are not axially aligned (nonlinear). Consequently, an additional step of "smoothing" such series of finite elements may be contemplated such that a single strut-like finite element 1102 replaces a number of nonlinear finite elements in a fashion that may serve to simplify the structure, eliminate redundant load paths, eliminate unnecessary and unrealistic interconnections, and reconfigure chains of disjointed strut-like finite elements as integral strut-like finite elements. In some implementations, the step of smoothing may also include relating one or more strut-like finite elements to actual, physically available parts, such that the computed structure could be more readily constructed. Furthermore, connections between strut-like finite elements may be specified to match how, for example, physical struts of a truss structure arrangement design are foreseen to be connected. For example, the strut-like finite elements could be specified to model a bolted connection, an adhesively bonded connection, or a pinned connection. As a result, the output of the optimization is a structure that is realizable with available hardware. Subsequently, the method may proceed with step 750 (FIG. 7).

Figure 10:
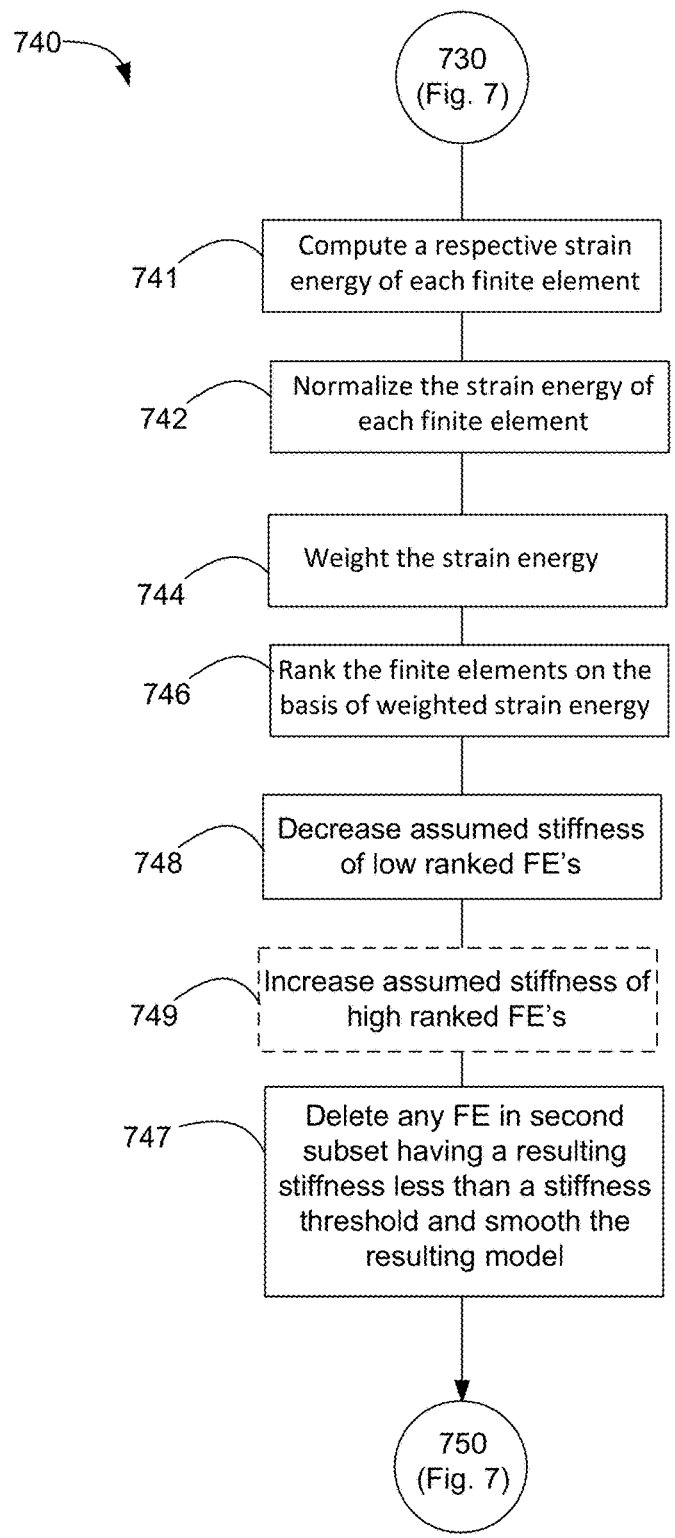
FIG. 10 illustrates a further example technique for creating a revised FEA model, according to an implementation.

Referring now to FIG. 10, some additional techniques for adjusting the FEA model according to some implementations will be described. As described in connection with FIG. 9, in some implementations, creating the revised FEA model according to block 740 includes computing, at block 741, a respective strain energy for each finite element in the FEA model. Each respective strain energy may relate to one or more dynamic vibration modes the modeled structure.

The computed respective strain energy for each finite element may be normalized at block 742 by the total strain energy found in all of the finite elements in the model. At block 744, the normalized strain energy may be weighted by one or more of (i) element length in order to normalize strain energy between elements of different lengths; (ii) eigenvalue in order to give elements contributing to the stiffness of lower modes more weight; and (iii) element volume which allows ranking on a strain energy density basis.

At block 746, the finite elements may be ranked on the basis of the weighted normalized strain energy. Finite elements having a high-rank may be those having a higher weighted and normalized strain energy, whereas finite elements having a low rank may be those having a lower weighted and normalized strain energy.

At block 748, the assumed stiffness of lower ranked finite elements may be decreased (decremented). At block 749, optionally, an assumed stiffness of higher-ranked finite elements may be increased (incremented). At block 747, finite elements which have a resulting stiffness less than a stiffness threshold may be deleted from the FEA model, the resulting model may be smoothed and the method may proceed with step 750 (FIG. 7).

Iterative adjustments of the FEA model as described hereinabove may result in establishing a sparse lattice FEA model that includes primarily or exclusively finite elements disposed on a discrete number of load paths. Advantageously, a truss like structure including a number of struts may be configured such that each of the struts is configured to align with a respective load path identified by the sparse lattice FEA model.

Figure 12:
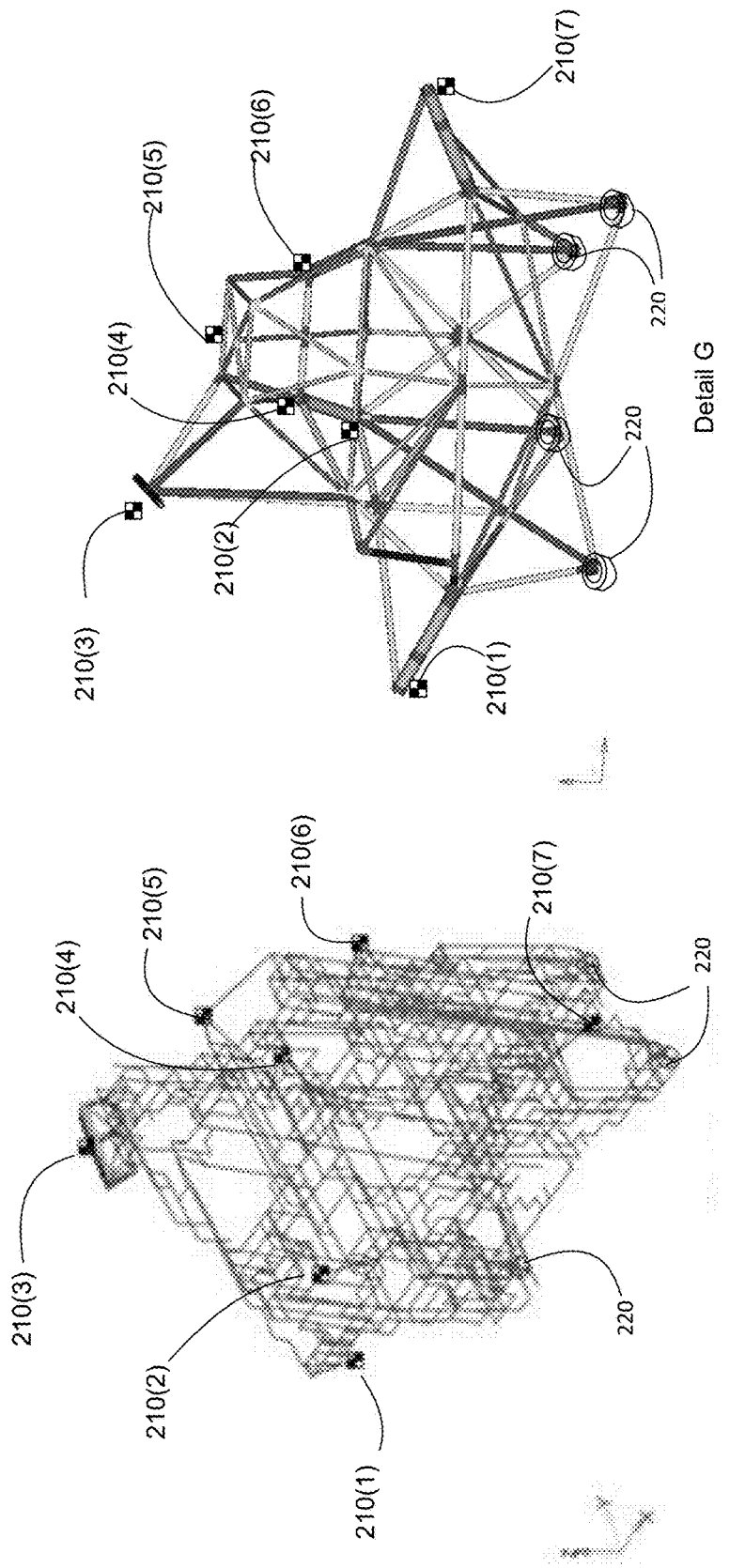
FIG. 12 illustrates an example technique for iterating a sparse finite element mesh toward a model of an optimized truss-like structure, according to an implementation.

The result of the deletion of FEA nodes (Nastran grids) and elements along with the smoothing and straightening of strut-like finite elements results in a sparse strut structural model that may not have the same number of nodes or absolute node location as defined in the original location(s) defined in the mesh 600 of FIG. 6. As a result, referring now to FIG. 12, a sparse finite element mesh (Detail F) may be iterated toward a model of an optimized truss-like structure (Detail G).

The above-described techniques enable significant reductions of the time and cost of designing truss-like structures, particularly structures intended to meet the requirements of a spacecraft application (low mass, high stiffness, tight alignment tolerances and low coefficient of thermal expansion).

Figure 13:
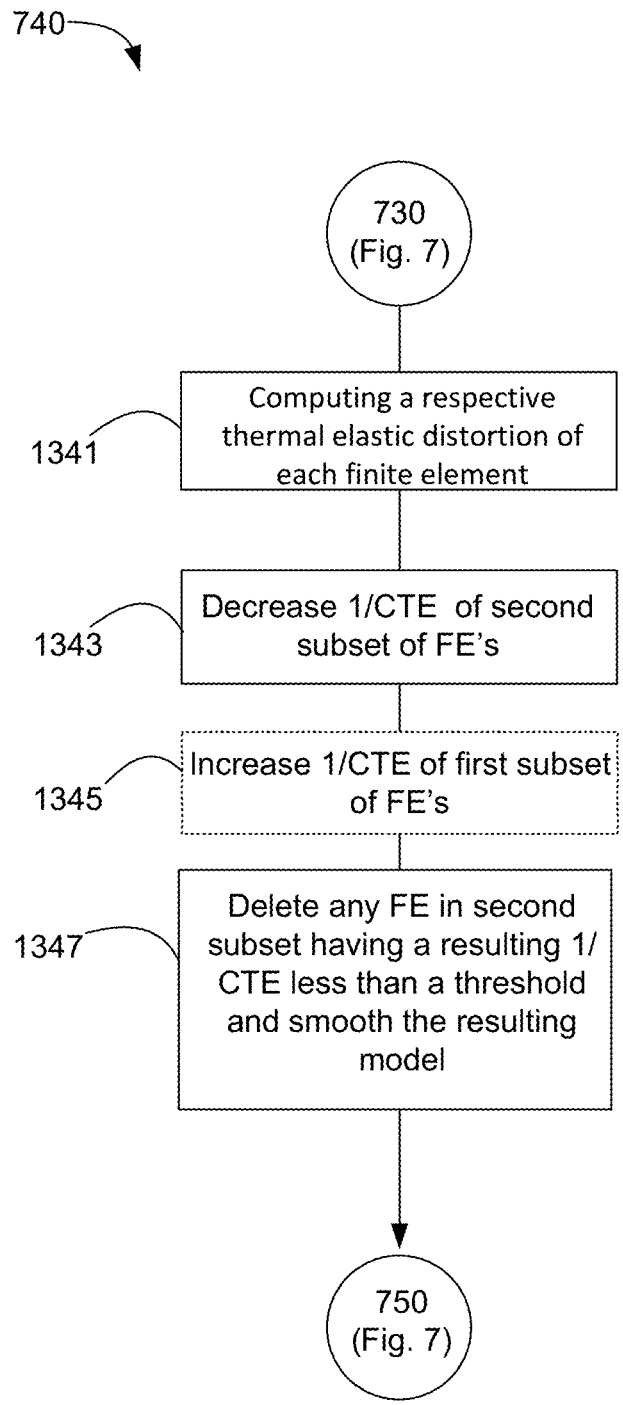
FIG. 13 illustrates yet another example technique for creating a revised FEA model, according to an implementation.

In order to provide a better understanding of the invention, example implementations have been described and illustrated hereinabove. However, many variations with respect to the specifically described implementations are possible. For example, it is contemplated that the optimization techniques disclosed herein may be used to obtain a more optimized mass of a structure where the system performance characteristic to be considered is thermal-induced distortion of the modeled structure. In such implementations, referring now to FIG. 13, creating the revised FEA model according to block 740 includes computing, at block 1341, a respective thermal elastic distortion for each finite element in the FEA model. Each computed value of thermal elastic distortion may relate to one or more hot or cold temperature extremes.

At block 1343 an assumed inverse of coefficient of thermal expansion (CTE) of a first subset of finite elements may be decreased (decremented). The assumed $CTE^{-1}$ may be decremented by changing an assumed dimension and/or material property of the finite element. In some implementations, the first subset of finite elements may include those finite elements having a respective thermal elastic distortion that is less than a first threshold. For example, the first subset of finite elements may include those finite elements having a below average respective thermal elastic distortion or those having a respective thermal elastic distortion that is less than an otherwise determined relative or absolute value.

At block 1345, optionally, an assumed $CTE^{-1}$ of a second subset of finite elements may be increased (incremented). The assumed $CTE^{-1}$ may be incremented by changing an assumed dimension and/or material property of the finite element. In some implementations, the second subset of finite elements may include those finite elements having a respective thermal elastic distortion that is greater than a second threshold. For example, the second subset of finite elements may include those finite elements having an above average respective computed thermal elastic distortion or those having a respective computed thermal elastic distortion that is greater than an otherwise determined relative or absolute value.

At block 1347, finite elements in the second subset which have a resulting $CTE^{-1}$ less than a threshold may be deleted from the FEA model and the resulting model may be smoothed. Subsequently, the method may proceed with step 750 (FIG. 7).

Implementations of the subject matter described in this specification may be implemented as one or more computer programs, i.e., one or more modules of computer program instructions, encoded on non-transitory computer readable medium for execution by, or to control the operation of, a computer.

Thus, improved truss-like structures and a method for designing such structures have been disclosed. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A structure supporting at least one component, the structure comprising:
   a truss-like frame structure including an arrangement design of at least four coupling nodes and at least six physical strut elements (struts) connected at a plurality of joints, each strut being disposed between and attached with a respective pair of the plurality of coupling nodes; wherein
   the arrangement design results from performing a quantitative optimization of an objective function corresponding to a system performance characteristic of the arrangement design, the system performance characteristic having a specified value and being one or more of stiffness, strength, or coefficient of thermal expansion of the arrangement design, the quantitative optimization comprising:
      generating a finite element analysis model, the analysis model including boundary conditions and an initial dense 3-D lattice mesh of strutlike finite elements, each strutlike finite element having a respective set of one or more assumed mechanical properties that model a respective simulated strut element, the boundary conditions including one or more input load parameters, and one or more of a mass, a moment of inertia and a thermal characteristic of at the at least one component;
      computing, with the finite element analysis model, a value for the objective function;
      optimizing the objective function by executing, on a processor, at least two cycles of an optimization loop, the optimization loop comprising:
         (a) computing a respective parameter of each strut-like finite element;
         (b) adjusting the finite element analysis model by: (i) decrementing the assumed mechanical property of a first subset of the finite elements, each element in the first subset having a respective computed parameter that is less than a first threshold; and (ii) deleting, from the finite element analysis model, any finite element in the first subset for which a resulting mechanical property is less than a second threshold;
         (c) computing, with the adjusted finite element analysis model, an updated value for the objective function; and
         determining, when the updated value for the objective function is within a desired tolerance of the specified value, that the adjusted finite element analysis model represents a sufficiently optimized arrangement design, and, when the updated value for the objective function is outside the desired tolerance, repeating steps (a) through (c).

2. The structure of claim 1, wherein adjusting the finite element analysis model includes incrementing the assumed mechanical property of a second subset of the finite elements, each element in the second subset having a respective computed parameter that exceeds a third threshold.

3. The structure of claim 1, wherein adjusting the finite element analysis model includes smoothing the resulting finite element analysis model.

4. The structure of claim 3, wherein smoothing the resulting finite element analysis model includes replacing two or more respective simulated strut-like finite elements with a single simulated strut-like finite element.

5. The structure of claim 4, wherein the two or more respective strut-like finite elements are respectively nonlinear.

6. The structure of claim 1, wherein each set of one or more assumed mechanical properties includes one or more of stiffness, strength, diameter, length, and a thermal characteristic of the respective simulated strut element.

7. The structure of claim 6, wherein, for at least the sufficiently optimized arrangement design, each set of one or more assumed mechanical assumed properties models a respective one of the plurality of physical strut elements.

8. A method for optimizing an arrangement design of a 3-D truss structure supporting at least one component, the arrangement design at least four coupling nodes and at least six physical strut elements (struts) connected at a plurality of joints, each strut being disposed between and attached with a respective pair of the plurality of coupling nodes, the method comprising:
   performing a quantitative optimization of an objective function corresponding to a system performance characteristic of the arrangement design, the system performance characteristic having a specified value and being one or more of stiffness, strength, or coefficient of thermal expansion of the arrangement design, the quantitative optimization comprising:
      generating a finite element analysis model, the analysis model including boundary conditions and a 3-D lattice mesh of strut-like finite elements, each strut-like finite element having a respective set of one or more assumed mechanical properties that model a respective simulated strut element, the boundary conditions including one or more input load parameters, and one or more of a mass and a moment of inertia of at the at least one component;
      computing, with the finite element analysis model, a value for the objective function;
      optimizing the objective function by executing, on a processor, at least two cycles of an optimization loop, the optimization loop comprising:
         a) computing a respective parameter of each strut-like finite element;
         b) adjusting the finite element analysis model by: (i) decrementing the assumed mechanical property of a first subset of the finite elements, each element in the first subset having a respective computed parameter that is less than a first threshold; and (ii) deleting, from the finite element analysis model, any finite element in the first subset for which a resulting mechanical property is less than a second threshold;
         (c) computing, with the adjusted finite element analysis model, an updated value for the objective function; and
         determining, when the updated value for the objective function is within a desired tolerance of the specified value, that the adjusted finite element analysis model represents a sufficiently optimized arrangement design, and, when the updated value for the objective function is outside the desired tolerance, repeating steps (a) through (c).

9. The method of claim 8, further comprising incrementing the assumed mechanical property of a second subset of the finite elements, each element in the second subset having a respective computed parameter that exceeds a third threshold.

10. The method of claim 8, further comprising smoothing the resulting finite element analysis model.

11. The method of claim 10, wherein smoothing the resulting finite element analysis model includes replacing two or more respective simulated strut-like finite elements with a single strut-like finite element.

12. The method of claim 11, wherein the two or more respective strut-like finite elements are respectively nonlinear.

13. The method of claim 8, wherein each set of one or more assumed mechanical properties includes one or more of stiffness, strength, diameter, length, and a thermal characteristic of the respective simulated strut element.

14. The method of claim 13, wherein, for at least the sufficiently optimized arrangement design, each set of one or more assumed mechanical assumed properties models a respective one of the plurality of physical strut elements.

15. A non-transitory computer readable medium having software stored thereon, the software including instructions for causing a computer to optimize an arrangement design of a 3-D truss structure supporting at least one component, the arrangement design including at least four coupling nodes and at least six physical strut elements (struts) connected at a plurality of joints, each strut being disposed between and attached with a respective pair of the plurality of coupling nodes, the software including instructions for:

performing a quantitative optimization of an objective function corresponding to a system performance characteristic of the arrangement design, the system performance characteristic having a specified value and being one or more of stiffness, strength, or coefficient of thermal expansion of the arrangement design, the quantitative optimization comprising:

generating a finite element analysis model, the analysis model including boundary conditions and a 3-D lattice mesh of strut-like finite elements, each strut-like finite element having a respective set of one or more assumed mechanical properties that model a respective simulated strut element, the boundary conditions including one or more input load parameters, and one or more of a mass and a moment of inertia of at the at least one component;

computing, with the finite element analysis model, a value for the objective function;

optimizing the objective function by executing, on a processor, at least two cycles of an optimization loop, the optimization loop comprising:

a) computing a respective parameter of each strut-like finite element;

b) adjusting the finite element analysis model by: (i) decrementing the assumed mechanical property of a first subset of the finite elements, each element in the first subset having a respective computed parameter that is less than a first threshold; and (ii) deleting, from the finite element analysis model, any finite element in the first subset for which a resulting mechanical property is less than a second threshold;

(c) computing, with the adjusted finite element analysis model, an updated value for the objective function; and determining, when the updated value for the objective function is within a desired tolerance of the specified value, that the adjusted finite element analysis model represents a sufficiently optimized arrangement design, and, when the updated value for the objective function is outside the desired tolerance, repeating steps (a) through (c).

16. The computer readable medium of claim 15, wherein each set of one or more assumed mechanical properties includes one or more of stiffness, strength, diameter, length, and thermal characteristic of the respective simulated strut element.

17. The computer readable medium of claim 16, wherein, for at least the sufficiently optimized arrangement design, each set of one or more assumed mechanical assumed properties models a respective one of the plurality of physical strut elements.

* * * * *